United States Patent [19]

Neidorff

[11] Patent Number: 4,558,286
[45] Date of Patent: Dec. 10, 1985

[54] SYMMETRICAL DIODE CLAMP

[75] Inventor: Robert A. Neidorff, Chandler, Ariz.

[73] Assignee: Motorola, Inc., Schaumburg, Ill.

[21] Appl. No.: 371,876

[22] Filed: Apr. 26, 1982

[51] Int. Cl.⁴ .......................................... H01L 27/04
[52] U.S. Cl. ...................................... 330/252; 357/35;
357/36; 357/44; 357/86; 357/48; 330/307;
307/557
[58] Field of Search ...................... 357/35, 36, 86, 44,
357/23 GP; 330/252, 254, 307; 307/559, 561,
551, 565, 299 B, 259, 353, 455, 557

[56] References Cited

U.S. PATENT DOCUMENTS

| | | | |
|---|---|---|---|
| 2,980,806 | 4/1961 | Ort | 307/567 |
| 3,829,718 | 8/1974 | Hart | 357/36 |
| 4,315,220 | 2/1982 | Findeisen | 328/150 |
| 4,388,632 | 6/1983 | Richardson | 357/15 |

OTHER PUBLICATIONS

Betts et al., "Differential Amplifier with Limiter", *IBM Tech. Discl. Bulletin*, vol. 13, No. 9, Feb. 1971, p. 2501.

*Primary Examiner*—William D. Larkins
*Assistant Examiner*—Charles S. Small, Jr.
*Attorney, Agent, or Firm*—Michael D. Bingham

[57] ABSTRACT

A two terminal monolithic integrated clamp circuit includes first and second circuits coupled between the two input terminals thereof for clamping the voltage appearing across the two terminals to a predetermined voltage. The first circuit is responsive to the voltage level appearing at the first terminal exceeding the voltage level at the second terminal by said predetermined amount for clamping the voltage level thereat while shunting the majority of the current through the clamping circuit to substrate ground of the integrated circuit. The second circuit is responsive to the voltage level appearing at the second terminal exceeding the voltage level at the first terminal by said predetermined amount for clamping the voltage thereat while shunting the majority of the current to substrate ground.

19 Claims, 4 Drawing Figures

SYMMETRICAL DIODE CLAMP

BACKGROUND OF THE INVENTION

The present invention relates to two-terminal clamping devices for clamping the voltage level at one terminal with respect to another terminal. More particularly, the invention relates to a monolithic symmetrical clamping circuit for providing shunt clamping whenever the voltage level at either terminal exceeds the voltage level at the other terminal by a predetermined amount. Specifically, the symmetrical clamp conducts at approximately ±2 diode voltage drops thereacross.

There are a myriad of clamping circuits in the prior art which are used to clamp a voltage appearing at one node with respect to a reference node. For instance, many NPN monolithic differential amplifier stage front ends require clamping in order to prevent long term damage to the NPN devices due to emitter-base junction voltages being applied thereto which are near or even exceed the breakdown characteristics of the junction during normal operation thereof. A good example of such a problem is the LM 311 Voltage Comparator Circuit, manufactured by Motorola, Inc. among others. To protect the base-emitter junctions of the NPN differential amplifier, the LM 311 includes a pair of series connected back-to-back Zener Diodes coupled across inputs of the NPN differential stage. This Zener diode clamp circuit clamps the voltage thereacross to approximately five or six volts. Although this prior art clamp circuit prevents breakdown of the base-emitter junctions of the NPN devices it does allow a significant reverse bias voltage to be applied thereto. In long term operation the junction of the NPN devices may be continually stressed which may cause damage to the stage and/or shifts in the $V_{be}$ of the devices. This is not desirable.

Additionally, the prior art clamp, when rendered conductive, shunts current from the higher voltage node to the lower referenced voltage node which can cause undesirable loading at the latter node of the differential stage.

Hence, there is a need for a simple, inexpensive two-terminal clamping circuit which operates to clamp the voltage across the two terminals to a much lower value than some prior art to prevent long term stresses on NPN differential stages while preventing loading to the lower voltage referenced terminal.

SUMMARY OF THE INVENTION

Accordingly, it is an object of the present invention to provide an improved clamping device.

It is another object of the present invention provide an improved clamping device suited for manufacture in monolithic form.

Still another object of the present invention is to provide a monolithic clamp for conducting at approximately two-diode voltage drops differentially applied thereacross while shunting current to substrate ground to prevent loading at one terminal thereof.

A further object of the present invention is to provide a two terminal monolithic clamp circuit for clamping the voltage at one terminal with respect to the other terminal at approximately two-diode voltage drops while shunting excessive current to substrate ground to inhibit loading at the lower voltage reference terminal.

A still further object of the present invention is to provide a two terminal monolithic clamp circuit for clamping the voltage at one terminal with respect to the other terminal wherein the clamp circuit is provided across the inputs of a NPN differential amplifier to protect the same from excessive reverse bias voltages.

In accordance with the above and other objects, there is provided a monolithic clamp circuit having first and second terminals for clamping the voltage thereacross to a predetermined value including first and second circuits each coupled between the first and second terminals and the substrate of the circuit. The first circuit is responsive to the voltage level at the first terminal exceeding the voltage level at said second terminal by a predetermined amount for clamping the voltage level thereat and for shunting a majority of the clamping current to the substrate. Similarly, the second circuit is responsive to the voltage level at the second terminal exceeding the voltage level at the first terminal by said predetermined amount for clamping the voltage thereat and for shunting a majority of the clamping current to the substrate.

DETAILED DESCRIPTION OF THE PREFERRED EMBODIMENT

Figure 1:
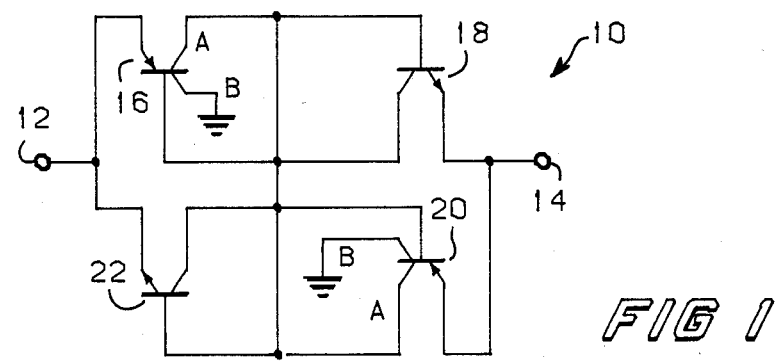
FIG. 1 is a schematic drawing illustrating the clamp circuit of the present invention.

Turning to FIG. 1 there is shown in schematic diagram form symmetrical operating diode clamp 10 of the present invention. Diode clamp 10 is a two terminal device (12 and 14) which requires no external power supply to clamp the voltage appearing thereacross to approximately ±2 $V_{be}$, where $V_{be}$ is the base-emitter voltage drop of a semiconductor transistor device. As illustrated, diode clamp 10 comprises two pairs of series connected diode-connected transistors 16, 18 and 20, 22 respectively. Transistor 16 and 20 are generally referred to as ringed-PNP transistors each having an emitter respectfully connected to terminals 12 and 14 of the clamp. Transistors 18 and 22 are NPN devices having respective emitters coupled to terminals 14 and 12. The collector and bases of transistors 18 and 22 are interconnected with the bases of transistors 16 and 20. The split collectors A of both transistors 16 and 20 are connected with the interconnected bases of the same devices with collectors B thereof being coupled to the substrate of the monolithic clamp circuit.

In operation, as the voltage level appearing at either one of the terminals 12 or 14 exceeds the voltage level at the other terminal by approximately 2 $V_{be}$ the clamp is rendered conductive to shunt current therethrough while clamping the voltage across the terminals to this voltage level. Hence, if the voltage level at terminal 12 exceeds the voltage level at terminal 14 by approximately 2 $V_{be}$, transistor 16 and 19 will be rendered conductive to clamp terminal 12 to this voltage level. As illustrated, transistor 16 is a split-collector device wherein the majority of the shunted current through the clamp is sourced to the substrate of the integrated circuit wherein only a fraction of the clamping current flows into terminal 14. As will be described more fully later, the shunting of current to the substrate inhibits an inbalance or loading of terminal 14 due to the shunt current. In some prior art clamp circuits, the clamp current is completely sourced from one terminal to the other which usually causes undesirable loading at the latter terminal. Similarly, when the voltage level at terminal 14 exceeds the voltage at terminal 12 by approximately 2 $V_{be}$, transistors 20 and 22 will be rendered conductive to clamp the voltage at terminal 14 to this level while shunting most of the clamp current to the substrate through collector B of split-collector transistor 20.

Figure 2:
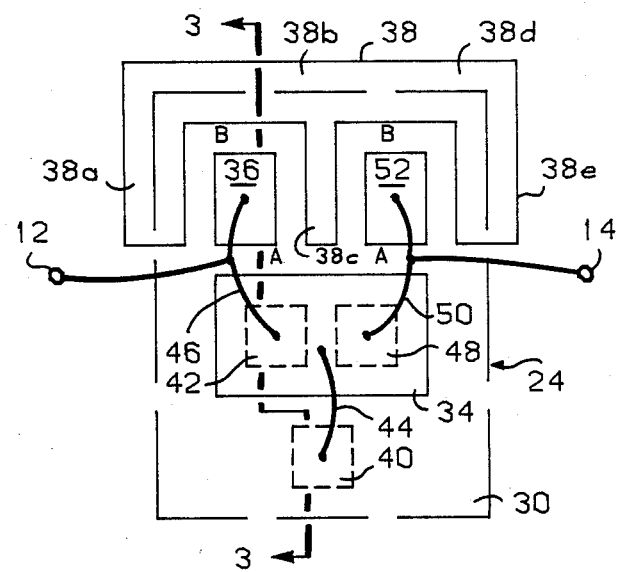
FIG. 2 is a topography view of a portion of an integrated circuit chip illustrating the transistors comprising the clamp of FIG. 1.
Figure 3:
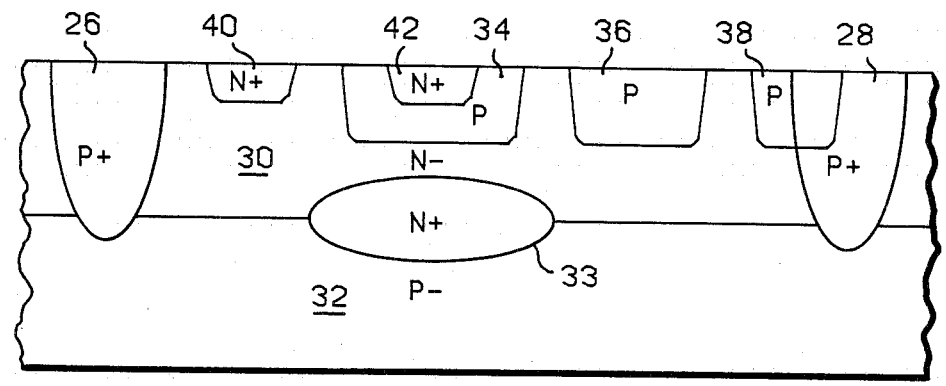
FIG. 3 is a cross section view of the integrated circuit chip of FIG. 2 taken in the direction of arrows 3—3.

FIGS. 2 and 3 illustrate the monolithic structure of diode clamp 10. One advantage over some prior art clamp devices is that clamp 10, as illustrated, is fabricated in a single isolation island 24 formed by isolation regions 26 and 28. An N- epi-layer 30 is formed over P- substrate 32 in a known manner. A deep N+ buried layer 33 may be formed as shown. P+ isolation regions 26 and 28 are formed in epi-layer 30 and contact substrate 32, for example, utilizing standard diffusion techniques. P regions 34, 36, and 38 are formed in epi-layer 30 utilizing standard photomasking and diffusion process techniques. These isolation regions isolate that portion of epi-layer 30 contained therebetween to form island 24 as is understood. N+ region 40 is formed in epi-layer 30 with N+ region 42 being formed in P region 34. Although the aforedescribed structure is for only one half of the clamp 10 it is to be understood that the other half, being symmetrical, is identical in structure.

It is seen that NPN transistors 18 and 22 share common base region 34 which is formed in epi-layer 30. The collector regions of transistors 18 and 20 are commonly formed in epi-layer 30 and are shorted together with the common bases thereof through N+ contact region 40 and metal contact 44 such that these devices function as diode-connected transistors as is understood. Epi-layer 30 also forms the base regions of the two PNP transistors 16 and 20 such that the bases thereof are commonly connected with the bases and collectors of NPN transistors 18 and 22. The emitter of transistor 22 is formed by N+ region 42 and is physically shorted by metal contact 46 both to the P region 36 and to input terminal 12. P region 36 forms the emitter of PNP transistor 16. Similarly, N+ region 48 which is formed in common base region 34 is the emitter of NPN transistor 18 and is physically shorted both to input terminal 14 and to the emitter of PNP transistor 20 via metal lead 50. The emitter of PNP transistor 20 is formed, for instance, by diffusion of P region 52 and to epi-layer 30.

PNP transistors 16 and 20 includes split-collector regions A and B respectively and are commonly referred to as ringed-collector devices. As shown, the base and emitter regions are surrounded on three sides of each respective device by P region 38 and on the fourth side by P region 34. Both of these P regions form the respective collector regions of the two devices. Thus, in the preferred embodiment, collector region B of transistor 16 is formed by P regions 38a, 38b and 38c which are shorted through isolation regions 26 and 28 to substrate 32. Collector region A of transistor 16 is formed by that portion of P region 34 located directly opposite of P region 36. Thus, as understood, three-fourths of the collector current of transistor 16 will be sourced to substrate 32 with one-fourth thereof being sourced from collector region A to transistor 18. Similarly, collector region P of transistor 20 is formed of regions 38c, 38d and 38e which are shorted to substrate 30; with collector A being formed by that portion of region 34 located directly opposite of P region 52. Hence, three-fourths of the collector current of transistor 20 is shorted to substrate 32 with the other one-fourth being sourced from collector region A to transistor 22 when these two devices are rendered conductive.

Figure 4:
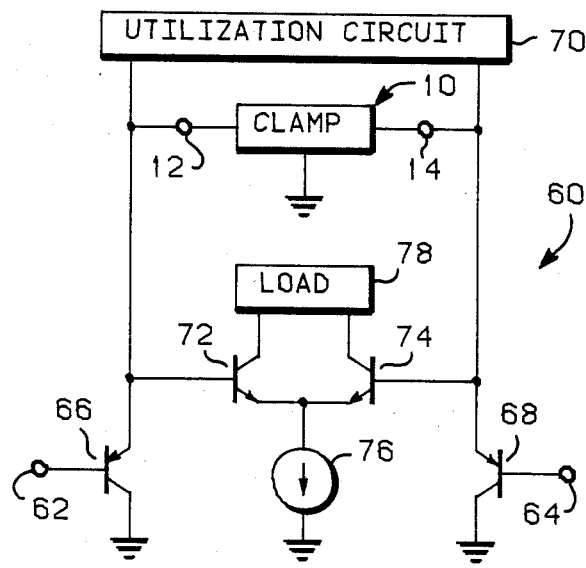
FIG. 4 is a schematic of a circuit utilizing the clamp circuit of the preferred embodiment of the present invention.

Turning to FIG. 4, a typical application for diode clamp 10 of the present invention is illustrated. It is to be understood that the present invention is not to be limited to this application as diode clamps may be utilized in many different applications. Circuit 60 may be a voltage comparator having a pair of inputs 62 and 64. Typically one of the inputs, for example, input 64 is adapted to receive a reference voltage while the other input receives a variable input voltage. PNP transistors 66 and 68 serve as a differential input having respective bases coupled to inputs 62 and 64 and collectors connected to ground reference potential. The emitters of transistors 66 and 68 are coupled to an utilization circuit 70 which may comprise a pair of current sources for sourcing current to each transistor 66 and 68 as is understood. An NPN differential amplifier stage comprising differentially connected NPN transistors 72 and 74 coupled to current source 76 is provided. The inputs of the NPN amplifier stage (the bases of transistor 72 and 74) are coupled respectively to the emitters of transistor 66 and 68. A load circuit 78 is coupled at the collector outputs of the NPN differential amplifier stage.

In normal operation of comparator 60, whenever the voltage level appearing at input 62 is less than the reference voltage supplied at input 64, transistor 66 will conduct to bias transistor 72 in off condition. Correspondingly, transistor 64 is turned off and transistor 74 is rendered conductive. At the other extreme, as the voltage level at input 62 exceeds the reference voltage, transistor 66 and 74 are turned off and transistors 68 and 72 are switched on to switch the output state at the output of the NPN differential amplifier stage. The operation of voltage comparator 60 is well known to those skilled in the art.

Diode clamp 10 is illustrated as having its two terminals 12 and 14 coupled to respective emitters of transistor 66 and 68; the inputs to the NPN differential amplifier stage. In operation, symmetrical clamp 10 is rendered operative whenever the voltage at either input 12 or 14 exceeds the other input by approximately 2 $V_{be}$ to clamp the voltage developed thereacross while shunting the current away from the nonconductive transistor 66 or 68. Hence, as the voltage at input 62 of comparator 60 becomes sufficient to force the voltage level at terminal 12 to exceed the voltage level at terminal 14 by 2 $V_{be}$, transistors 16 and 18 of clamp 10 are rendered conductive to clamp the voltage at terminal 12 while shunting the current from transistor 66. As aforementioned, three-fourths of the shunted current will be shorted to the substrate of the integrated circuit through collector region B of transistor 16 while the other one-fourth of the shunted current is sourced to terminal 14 through transistor 18. Hence, the base-emitter junction voltage of NPN transistors 72 and 74 are limited to an excursion of 1.5 to 2.0 volts in any reverse bias state so that these devices will not be damaged. Additionally, since only one-fourth of the clamp current is sourced through the clamp to the other terminal, terminal 14 is not greatly loaded by becoming imbalanced with respect to the normal current sourced thereto in its normal operating state.

Thus, what has been described, is a novel symmetrical clamp suited to be manufactured in monolithic integrated circuit form. The clamp is simple in structure and is inexpensive: requiring only a single isolation region to be utilized in realizing the integrated circuit. The clamp provides a nominal voltage thereacross as the voltage level at one input terminal exceeds the voltage level at the other input terminal by a predetermined value while shunting current to the substrate of the integrated circuit to inhibit loading effects at the terminal having the lower voltage level.

I claim:

1. A monolithic integrated, symmetrical clamp circuit, comprising:
    first and second terminals;
    first circuit means coupled between said first and second terminals and the substrate of the integrated diode clamp circuit, said first circuit means being responsive to the voltage level at said first terminal exceeding the voltage level at said second terminal by a predetermined amount for clamping the voltage level thereat and for shunting a majority of the clamping current through the diode clamp circuit to said substrate;
    said first circuit means including a first transistor of a first conductivity type having first and second collectors, a base and an emitter, said emitter being coupled to said first terminal, said first collector being coupled to said substrate; and a second transistor of a second conductivity type having a collector, a base and an emitter, said emitter being coupled to said second terminal, said collector and base being interconnected with said base and second collector of said first transistor; and
    second circuit means coupled between said first and second terminals and the substrate of the integrated diode clamp circuit, said second circuit means being responsive to the voltage level at said second terminal exceeding the voltage level at said first terminal by a predetermined amount for clamping the voltage level thereat and for shunting a majority of the clamping current through the diode clamp circuit to said substrate.

2. The clamp of claim 1 wherein the area of said first collector of said first transistor is ratioed with respect to the area of said second collector thereof.

3. The clamp of claim 2 wherein said collector ratio is 3:1.

4. The clamp of claim 1 or 3 wherein said second circuit means includes:
    a third transistor of said first conductivity type having first, second collectors, a base and an emitter, said emitter being coupled to said second terminal, said first collector being coupled to said substrate, said second collector and base being interconnected with said collector and base at said second transistor; and
    a fourth transistor of said second conductivity type having a collector, a base and an emitter, said emitter being coupled to said first terminal, said base and collector being interconnected with said base at second collector of said third transistor.

5. The clamp of claim 4 wherein the area of said first collector of said third transistor is ratioed with respect to the area of said second collector thereof.

6. The clamp of claim 5 wherein said collector ratio is 3:1.

7. A monolithic integrated clamp circuit for clamping the voltage at one terminal with respect to another terminal at a predetermined voltage level, comprising:
    a substrate formed of a semiconductor material of first conductivity type;
    an epitaxial layer formed on said substrate of a semiconductor material of second conductivity type, said epitaxial layer being contained in an isolated pocket region;
    a plurality of regions of semiconductor material of said first conductivity type formed in said epitaxial layer in spaced relationship to one another; at least a first one of said regions being electrically shorted to said substrate;
    a plurality of regions of semiconductor material of said second conductivity type, at least two of said regions being formed in spaced relationship to each other in a second one of said plurality of regions of said first conductivity type and a third of said regions of said second conductivity type being formed in said epitaxial region;
    first conductivity means for electrically shorting said third region of said second conductivity type to said second one of said regions of said first conductivity type;
    second conductive means electrically shorting one of said at least two regions with a third one of said plurality of regions of said first conductivity type to the one terminal, said third one of said regions of first conductivity type being in spaced relationship to said at least one region and said second one of said plurality of regions of said first conductivity type; and
    third conductive means electrically shorting the other of said at least two regions with a fourth one of said plurality of regions of said first conductivity type to the another terminal, said fourth of said first conductivity type being in spaced relationship to both said at least one region and said second one of said regions of said first conductivity type.

8. The clamp circuit of claim 7 wherein said at least one region of said first conductivity type is spaced from and symmetrically surrounds major portions of each of said third and fourth regions of said first conductivity type.

9. The clamp circuit of claim 8 wherein said second region of said first conductivity type is symmetrically spaced from the remaining portions of said third and fourth regions of said first conductivity type.

10. The clamp circuit of claim 9 wherein said epitaxial layer, said another one region, and said at least one region surrounding said third region form a transistor of first conductivity type having an emitter coupled to the one terminal, a base and first collector connected together at a first node and a second collector electrically shorted to said substrate.

11. The claim circuit of claim 10 wherein said epitaxial layer, said another one region, and said at least one region surrounding said fourth region form a transistor of said first conductivity type having an emitter coupled to the another terminal, a base and a first collector connected together at said first node and a second collector electrically shorted to said substrate.

12. The clamp circuit of claim 11 wherein a first one of said at least two regions of second conductivity type, said another one region of said first conductivity type and said epitaxial layer forming a third transistor of second conductivity type having an emitter coupled to the one terminal and a base and collector connected to said first node.

13. The clamp circuit of claim 12 wherein the second one of said at least two regions of second conductivity type, said another one region of said first conductivity type and said epitaxial layer form a fourth transistor of second second conductivity type having an emitter coupled to the another terminal, and a base and collector connected to said first node.

14. In combination with a monolithic integrated NPN differential amplifier stage having first and second inputs, a symmetrical clamping circuit, comprising:

first and second terminals said first terminal being coupled to the first input and said second terminal beng coupled to the second input of the NPN amplifier;

first circuit means coupled between said first and second terminals and the substrate of the integrated diode clamp circuit, said first circuit means being responsive to the voltage level at said first terminal exceeding the voltage level at said second terminal by a predetermined amount for clamping the voltage level thereat and for shunting a majority of the clamping current through the diode clamp circuit to said substrate, said first circuit means including a first transistor of a first conductivity type having first and second collectors, a base and an emitter, said emitter being coupled to said first terminal, said first collector being coupled to said substrate, and a second transistor of a second conductivity type having a collector, a base and an emitter, said emitter being coupled to said second terminal, said collector and base being interconnected with said base and second collector of said first transistor; and second circuit means coupled between said first and second terminals and the substrate of the integrated diode clamp circuit, said second circuit means being responsive to the voltage level at second terminal exceeding the voltage level at said first terminal by a predetermined amount for clamping the voltage level thereat and for shunting a majority of the clamping current through the diode clamp circuit to said substrate.

15. The clamp of claim 14 wherein the area of said first collector of said first transistor is ratioed with respect to the area of said second collector thereof.

16. The clamp of claim 15 wherein said collector ratio is 3:1.

17. The clamp of claim 14 or 16 wherein said second circuit means includes:

a third transistor of said first conductivity type having first, second collectors, a base and an emitter, said emitter being coupled to said second terminal, said first collector being coupled to said substrate, said second collector and base being interconnected with said collector and base at said second transistor; and a fourth transistor of said second conductivity type having a collector, a base and an emitter, said emitter being coupled to said first terminal, said base and collector being interconnected with said base at second collector of said third transistor.

18. The clamp of claim 17 wherein the area of said first collector of said third transistor is ratioed with respect to the area of said second collector thereof.

19. The clamp of claim 18 wherein said collector ratio is 3:1.

* * * * *

UNITED STATES PATENT AND TRADEMARK OFFICE
CERTIFICATE OF CORRECTION

PATENT NO. : 4,558,286

DATED : Dec. 10, 1985

INVENTOR(S) : Robert A. Neidorff

It is certified that error appears in the above-identified patent and that said Letters Patent is hereby corrected as shown below:

Column 6, claim 10, line 2, delete "another one" and insert --second-- therefor.

Column 7, claim 13, line 9, delete "second" first occurrence and insert --said-- therefor.

Signed and Sealed this

Thirteenth Day of December, 1988

Attest:

DONALD J. QUIGG

*Attesting Officer*   *Commissioner of Patents and Trademarks*